(12) United States Patent
Hong et al.

(10) Patent No.: US 11,083,084 B2
(45) Date of Patent: Aug. 3, 2021

(54) STRETCHABLE PLATFORM FORMATION METHOD AND STRETCHABLE PLATFORM

(71) Applicant: Seoul National University R&DB FOUNDATION, Seoul (KR)

(72) Inventors: Yongtaek Hong, Seoul (KR); Yunsik Joo, Gyeonggi-do (KR); Jae-Young Yoon, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 16/477,081

(22) PCT Filed: Jan. 8, 2018

(86) PCT No.: PCT/KR2018/000333
§ 371 (c)(1),
(2) Date: Jul. 10, 2019

(87) PCT Pub. No.: WO2018/131850
PCT Pub. Date: Jul. 19, 2018

(65) Prior Publication Data
US 2019/0335582 A1      Oct. 31, 2019

(30) Foreign Application Priority Data
Jan. 10, 2017   (KR) .................. 10-2017-0003611

(51) Int. Cl.
*H05K 1/02*    (2006.01)
*G01M 5/00*    (2006.01)

(52) U.S. Cl.
CPC ............ *H05K 1/0283* (2013.01); *G01M 5/00* (2013.01)

(58) Field of Classification Search
CPC .......... H05K 1/02; H05K 1/0283; G01M 5/00
USPC ....................................................... 174/254
See application file for complete search history.

(56) References Cited

U.S. PATENT DOCUMENTS

2009/0102064 A1   4/2009   Sawada et al.
2013/0168841 A1   7/2013   Zhao et al.

FOREIGN PATENT DOCUMENTS

| JP | 2012-028600 A | 2/2012 |
|----|---|---|
| KR | 10-1161301 B1 | 7/2012 |
| KR | 10-2014-0038680 A | 3/2014 |
| KR | 10-2014-0076358 A | 6/2014 |
| KR | 10-2015-0004819 A | 1/2015 |
| KR | 10-2015-0077899 A | 7/2015 |

(Continued)

OTHER PUBLICATIONS

Lee et al., Machine Translation of KR 10-2014-0076358 (Jun. 20, 2014).*

(Continued)

*Primary Examiner* — Tremesha S Willis
(74) *Attorney, Agent, or Firm* — Paratus Law Group, PLLC

(57) ABSTRACT

A method for forming a stretchable platform according to one embodiment comprises: (a) a step of forming an adhesive layer on one surface of a rigid member; (b) a step of modifying one surface of a stretchable substrate and an adhesive layer surface to form an incomplete bond; and (c) a step of bonding so as to form a covalent bond between the one surface of a modified stretchable substrate and the adhesive layer surface.

10 Claims, 8 Drawing Sheets

(56) References Cited

FOREIGN PATENT DOCUMENTS

KR   10-2015-0138913 A   12/2015
KR   10-2016-0136125 A   11/2016

OTHER PUBLICATIONS

International Search Report and Written Opinion in related PCT Application No. PCT/KR2018/000333, dated Apr. 27, 2018, with English Translation (28 pages).
International Preliminary Report on Patentability in related PCT Application No. PCT/KR2018/000333, dated Jul. 16, 2019, with English Translation (25 pages).
International Search Report and Written Opinion in related PCT Application No. PCT/KR2017/010448, dated Jan. 19, 2018, with English Translation (17 pages).
International Preliminary Report on Patentability in related PCT Application No. PCT/KR2017/010448, dated Jul. 9, 2019, with English Translation (14 pages).
U.S. Appl. No. 16/476,784, filed Jul. 9, 2019, Yongtaek Hong.

* cited by examiner

[Fig. 1]
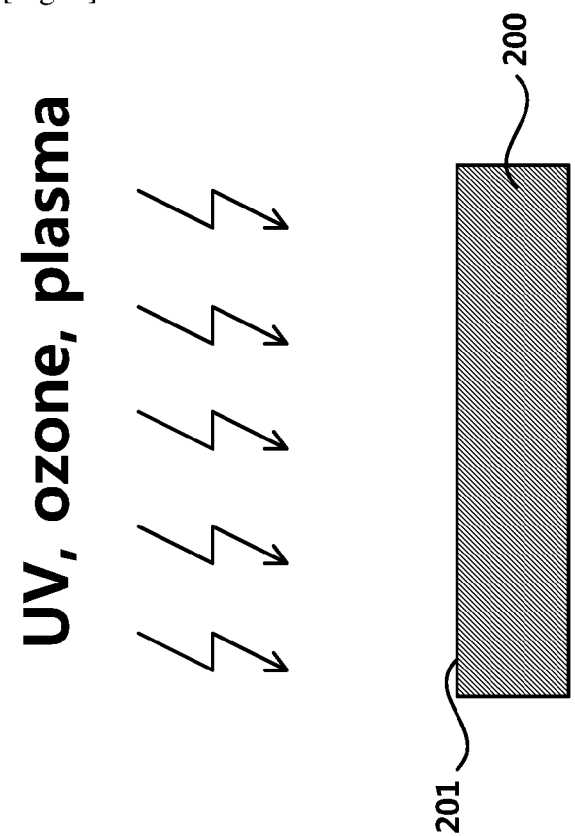
[Fig. 2]
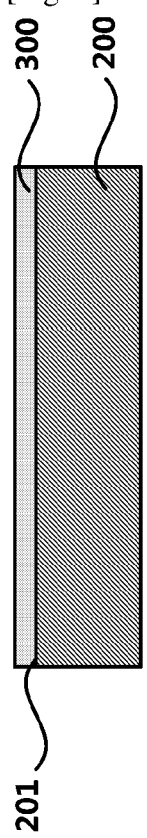

[Fig. 3]
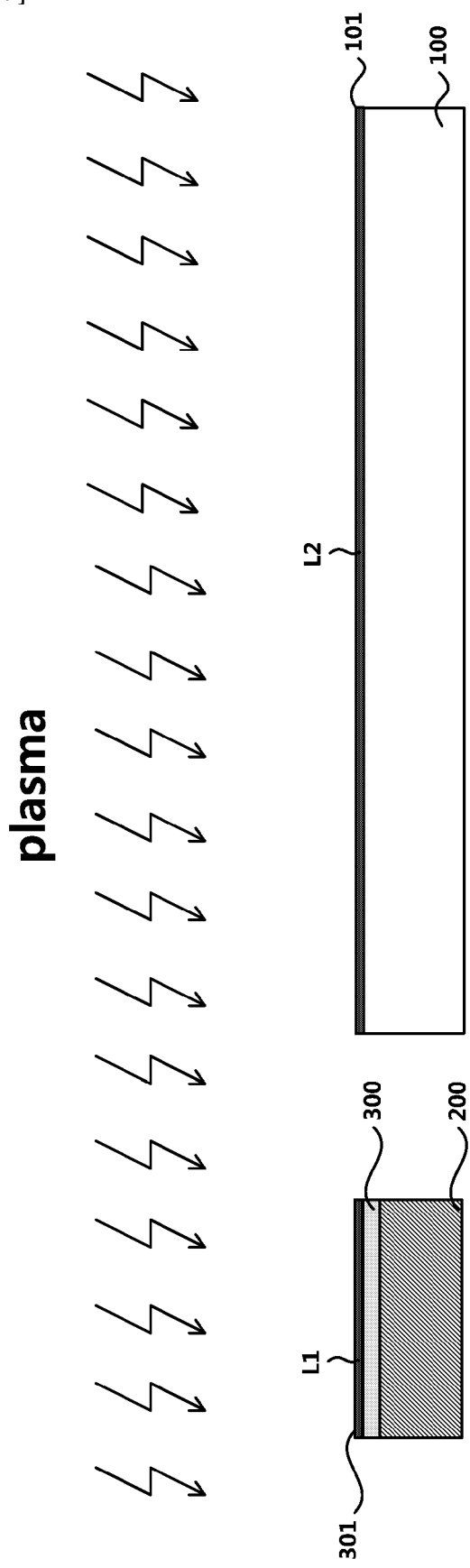

[Fig. 4]
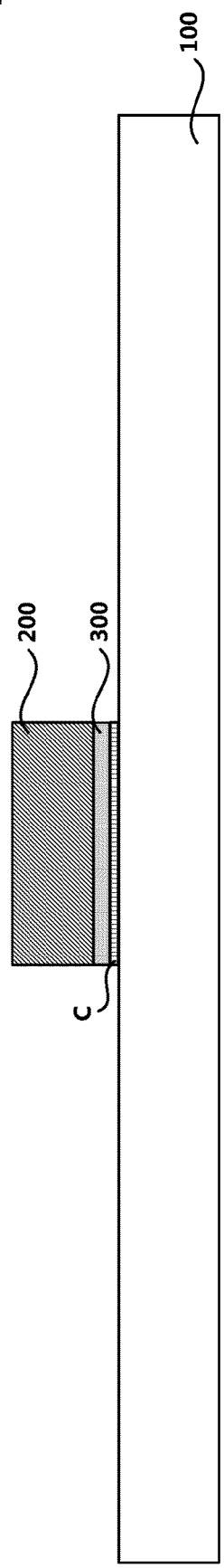

[Fig. 5]
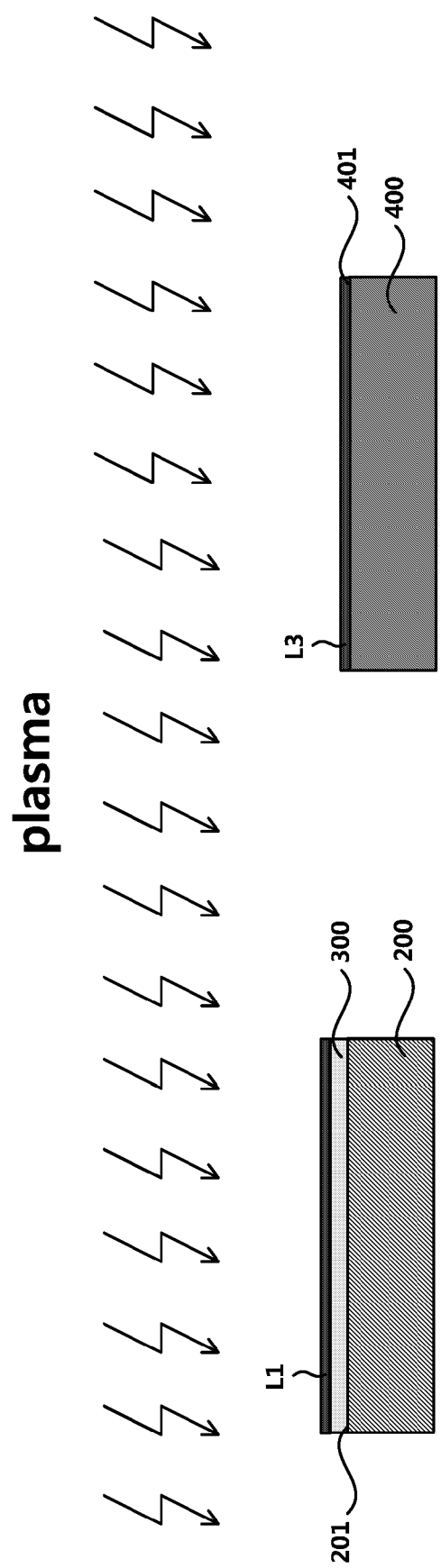

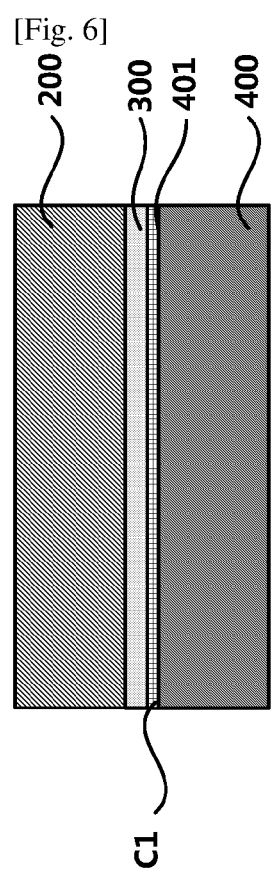
[Fig. 6]

[Fig. 7]
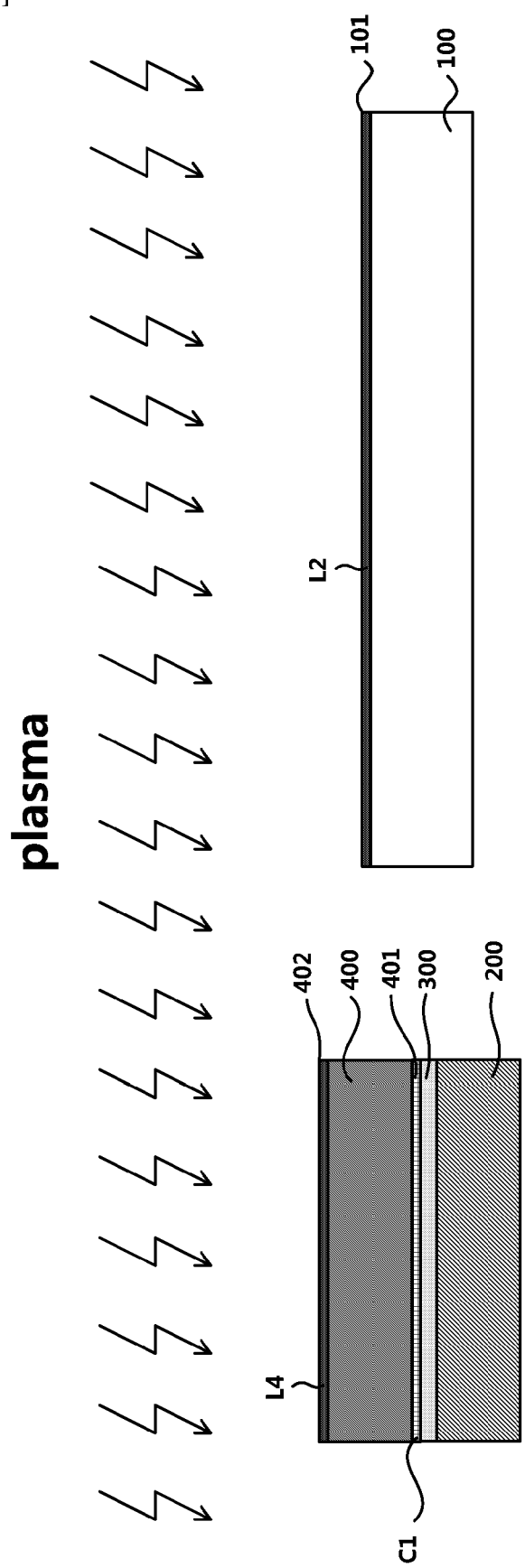

[Fig. 8]
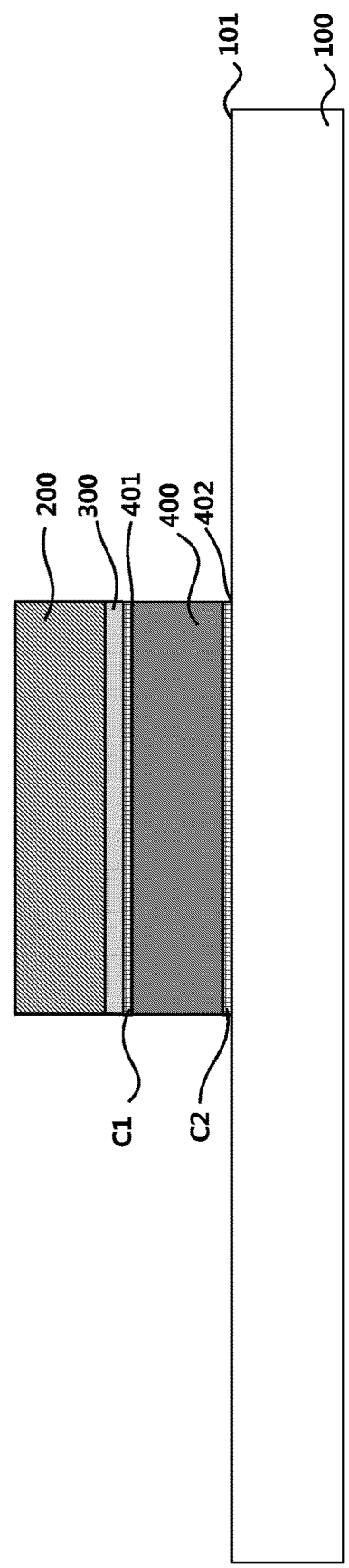

STRETCHABLE PLATFORM FORMATION METHOD AND STRETCHABLE PLATFORM

TECHNICAL FIELD

Embodiments relate to a stretchable platform formation method and a stretchable platform.

BACKGROUND ART

The materials constituting electronic devices and circuits have large Young's Modulus and are mostly solid. However, they do not have elasticity and are easily broken by external strain. In order to implement stretchable electronic devices or circuits, there is a need for a strain distribution structure capable of protecting strain-sensitive devices or substances from strain in a stretchable environment.

DISCLOSURE

Technical Problem

Conventional stretchable platforms into which rigid islands are inserted operate reliably in only a low strain region. Also, a device has to be implemented on a stretchable substrate. Thus, a device production method is particular due to issues caused by a difference in surface energy. As another platform production method, a material having a high Young's modulus may be directly produced on a stretchable substrate and then patterned. In this case, however, there are limitations on the kinds of materials producible on the stretchable substrate, and also there is a need for a comparatively complicated patterning technique such as photolithography and masking.

The embodiments are intended to solve the limitations and problems of the prior art, and one of the main objects of the embodiments is to provide a platform capable of operating stably even when a high strain is provided and also a manufacturing method thereof.

Technical Solution

A stretchable platform formation method according to an embodiment includes steps of: (a) forming an adhesive layer on one surface of a rigid member, (b) modifying one surface of a stretchable substrate and a surface of the adhesive layer such that an incomplete bond is formed, and (c) bonding the modified surface of the stretchable substrate and the modified surface of the adhesive layer such that a covalent bond is formed therebetween.

A stretchable platform formation method according to another embodiment includes steps of: (a) forming an adhesive layer on one surface of a rigid member, (b) modifying one surface of a buffer pattern and one surface of the adhesive layer such that an incomplete bond is formed, (c) bonding the modified surface of the buffer pattern and the modified surface of the adhesive layer, (d) modifying the other surface of the buffer pattern and one surface of a stretchable substrate such that an incomplete bond is formed, and (e) bonding the other surface of the buffer pattern and the one surface of the stretchable substrate.

A stretchable platform according to an embodiment includes a stretchable substrate, a rigid member located on the stretchable substrate, and an adhesive layer located between the stretchable substrate and the rigid member and configured to bond the stretchable substrate and the rigid member, wherein the adhesive layer forms a covalent bond with the stretchable substrate to bond the stretchable substrate and the rigid member.

A stretchable platform according to another embodiment includes a stretchable substrate, a rigid member located on the stretchable substrate, a buffer pattern located between the rigid member and the stretchable substrate, and an adhesive layer located between the rigid member and the buffer pattern and configured to bond the rigid member and the buffer pattern, wherein the adhesive layer forms a covalent bond with the buffer pattern to bond the rigid member and the buffer pattern.

Advantageous Effects

Provided are a platform operating stably even when a high strain is provided and a manufacturing method thereof.

DESCRIPTION OF DRAWINGS

FIGS. 1 to 4 are sectional views illustrating a stretchable platform formation method according to an embodiment.

FIGS. 5 to 8 are sectional views illustrating a stretchable platform formation method according to an embodiment.

MODES OF THE INVENTION

Figure 9A:
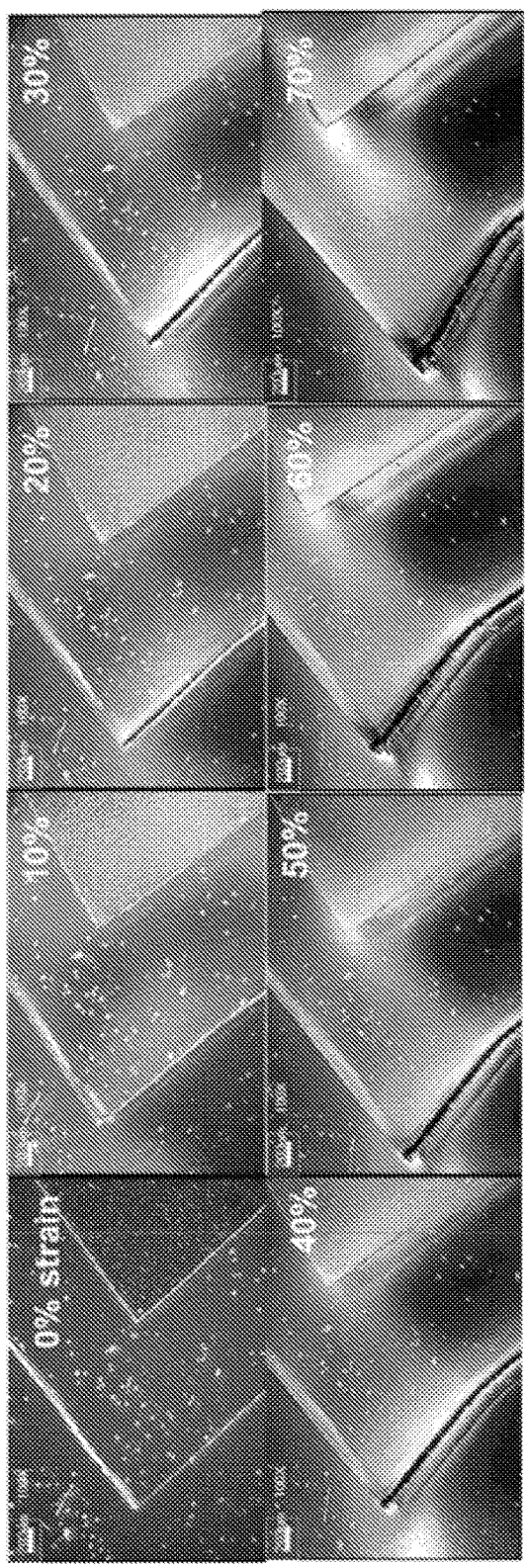
FIG. 9A is a diagram showing a captured state in which a stretching force is provided to the stretchable platform.

The description of the present invention merely provides examples for structural and functional illustration, and thus the scope of the present invention should not be construed as being limited by these examples. That is, since the present invention may be variously modified and have several exemplary embodiments, the scope of the present invention should be understood as including equivalents by which the spirit of the present invention can be achieved.

The terms used herein should be understood as follows.

The terms first, second, and the like may only be used to distinguish one element from another, and thus the scope of the present invention should not be limited by the terms. For example, a first element could be termed a second element, and similarly, a second element could be termed a first element.

It should be understood that when one element is referred to as being "above" another element, it may be on another element directly or with still another element intervening therebetween. On the other hand, it should be understood that when one element is referred to as being "on" another element, there is no intervening element therebetween. Other words used to describe the relationship between elements should be interpreted in a like fashion (e.g., "between," versus "directly between," "adjacent," versus "directly adjacent," etc.).

It should be understood that the singular forms "a," "an," and "the" are intended to include the plural forms as well, unless the context clearly indicates otherwise. Further, it should be understood that the terms "comprises," "comprising," "includes" and/or "including," when used herein specify the presence of stated features, integers, steps, operations, elements, components, or groups thereof, but do not preclude the presence or addition of one or more other features, integers, steps, operations, elements, components, and/or groups thereof.

The steps may be performed in different orders unless the order is specifically stated. That is, the respective steps may be performed in the same order as described, substantially simultaneously, or in reverse order.

Unless otherwise defined, all terms used herein have the same meaning as commonly understood by one of ordinary skill in the art to which this invention belongs. Terms, such as those defined in commonly used dictionaries, should be interpreted as having a meaning that is consistent with their meaning in the context of the relevant art and will not be interpreted in an idealized or overly formal sense unless expressly so defined herein.

For convenience of description, the drawings referred to in the embodiments of the present disclosure are deliberately exaggerated in size, height, thickness, and the like, but are not enlarged or reduced in regards to the ratio. Also, any elements shown in the drawings may be deliberately reduced, or other elements may be deliberately enlarged.

First Embodiment

A stretchable platform formation method and a stretchable platform according to a first embodiment of the present invention will be described below with reference to the accompanying drawings. FIGS. 1 to 4 are sectional views illustrating the stretchable platform formation method according to this embodiment.

An adhesive layer 300 is formed on a rigid member 200. Referring to FIG. 1, one surface 201 of the rigid member 200 is modified through an ultraviolet (UV), ozone (O3), or plasma treatment. As an example, through the surface modification process, the property of the surface 201 of the rigid member 200 may be changed from hydrophobicity to hydrophilicity. In an embodiment, the rigid member 200 may be formed of various materials such as plastic, paper, metal, polyimide, a metal thin film, and glass. The rigid member 200 may have a higher Young's modulus than a substrate 100 and a buffer pattern 400 (referring to FIG. 5) which will be described below.

Referring to FIG. 2, the adhesive layer 300 is formed on the modified surface 201 of the rigid member 200. Through the surface modification, the adhesive layer 300 may be formed on the surface 201 of the rigid member 200. In an embodiment, the adhesive layer 300 may be formed of a silane-based organic material. As an example, the silane-based organic material may include an aminosilane-based material such as (3-Aminopropyl) triethoxysilane (APTES), (3-Aminopropyl) trimethoxysilane (APTMS), 3-Aminopropyl (diethoxy) methylsilane, and ethyltrimethoxysilane.

As an example, the adhesive layer 300 may be formed on the surface 201 of the rigid member by utilizing a method and/or apparatus such as drop casting, spin coating, and a doctor blade.

Referring to FIG. 3, one surface 101 of a stretchable substrate 100 and one surface 301 of an adhesive layer 300 formed on the rigid member 200 are modified such that an incomplete bond is formed on each of the surface of the stretchable substrate 100 and the surface of the adhesive layer 300 formed on the rigid member 200. In an embodiment, the stretchable substrate 100 may contain a silicon-based elastomer. As an example, the silicon-based elastomer may be polydimethylsiloxane (PDMS) or EcoFlex.

In an embodiment illustrated in FIG. 3, the process of modifying the surface 101 of the stretchable substrate 100 and the surface 301 of the adhesive layer 300 may be performed by plasma-treating the surface 101 of the stretchable substrate 100 and the surface 301 of the adhesive layer 300. As an example, the plasma treatment process may be performed using oxygen plasma, air plasma, and various other plasma treatments.

Through the plasma-based surface modification process, a bond between molecules forming the surface 101 of the stretchable substrate 100 is broken and thus an incomplete bond L2 is exposed, and also a bond between molecules forming the surface of the adhesive layer 300 is broken and thus an incomplete bond L1 is exposed. FIG. 3 shows a layer shape in which the bond between the molecules forming the surface 101 of the stretchable substrate 100 and the bond between the molecules forming the surface 301 of the adhesive layer 300 are broken and exposed. The thickness is exaggerated for easier understanding.

Referring to FIG. 4, the modified surface 101 of the stretchable substrate 100 is bonded to the modified surface 301 of the adhesive layer 300 such that a covalent bond is formed between the stretchable substrate 100 and the adhesive layer 300. An incomplete bond region exposed to the surface of the adhesive layer 300 and the surface of the stretchable substrate forms a covalent bond region C through mutual bonding. In an embodiment, when the stretchable substrate 100 is formed of PDMS, which is a silicon-based elastomer, and the adhesive layer 300 is formed of a silicon-based organic material, a siloxane bond (—Si—O—Si—O—), which is a kind of covalent bond between silicon and oxygen, is formed in the covalent bond region C. As an example, the bonding process may be performed in a pressurized manner. Alternatively, the bonding process may be performed in a non-pressurized manner.

Through the covalent bond, the adhesive layer 300 and the stretchable substrate 100 form a kind of chemical bond and are not detached from each other even though a high strain is applied compared to the conventional technique.

Second Embodiment

A stretchable platform formation method according to the second embodiment of the present invention will be described below with reference to FIGS. 5 to 8. However, parts identical or similar to those of the above-described embodiment may be omitted for the sake of brevity and clarity.

Referring to FIG. 5, one surface 401 of a buffer pattern 400 and one surface 301 of an adhesive layer 300 formed on one surface 201 of a rigid member 200 are plasma-treated. As described in the above-described embodiment, the plasma treatment may be performed in a plasma chamber and may be performed using a plasma such as oxygen plasma, air plasma, or the like.

The buffer pattern 400 may be formed of a silicon-based elastomer. In an embodiment, the buffer pattern 400 may have a higher Young's modulus than the stretchable substrate 100.

In an embodiment, the adhesive layer 300 may be formed of a silane-based organic material, as described above. As an example, the silane-based organic material may include an aminosilane-based material such as (3-Aminopropyl) triethoxysilane (APTES).

Through the plasma-based surface modification process, a bond between molecules forming the surface 401 of the buffer pattern 400 is broken and thus an incomplete bond L3 is exposed, and also a bond between molecules forming the surface of the adhesive layer 300 is broken and thus an incomplete bond L1 is exposed. FIG. 5 shows a layer shape in which the bond between the molecules forming the surface 101 of the stretchable substrate 100 and the bond between the molecules forming the surface 301 of the adhesive layer 300 are broken and exposed. The thickness is exaggerated for easier understanding.

Referring to FIG. 6, the modified surface 401 of the buffer pattern 400 is bonded to the modified surface 301 of the adhesive layer 300 such that a covalent bond is formed between the buffer pattern 400 and the adhesive layer 300. An incomplete bond region exposed on the surface of the adhesive layer 300 and the surface of the stretchable substrate forms a covalent bond region C1 through a covalent bond caused by mutual bonding.

As an example, when the adhesive layer 300 is formed of a silane-based organic material, the covalent bond of the silicon broken by the plasma surface treatment is mutually bonded to the buffer pattern 400 to form the bond region C1. A siloxane bond (—Si—O—Si—O—), which is a kind of covalent bond between silicon and oxygen included in the buffer pattern 400 and the adhesive layer 300, is formed in the bond region C1. As an example, the bonding process may be performed in a pressurized manner. Alternatively, the bonding process may be performed in a non-pressurized manner.

Referring to FIG. 7, one surface of the stretchable substrate 100 and the other surface 402 of the buffer pattern 400 are surface-treated using plasma. The process of surface-treating the other surface 402 of the buffer pattern 400 and the one surface of the stretchable substrate 100 may be performed in a plasma chamber using oxygen plasma, air plasma, and various other plasma treatments.

In an embodiment, the process of surface-treating the buffer pattern 400 and the stretchable substrate 100 using plasma may be the same process as the process of surface-treating the buffer pattern 400 and the adhesive layer 300.

Through the plasma-based surface modification process, a bond between molecules forming the surface 101 of the stretchable substrate 100 is broken and thus an incomplete bond L2 is exposed, and also a bond between molecules forming the other surface 402 of the buffer pattern 400 is broken and thus an incomplete bond L4 is exposed. FIG. 7 shows a layer shape L in which the bond between the molecules forming the surface 101 of the stretchable substrate 100 and the bond between the molecules forming the surface 301 of the adhesive layer 300 are broken and exposed. The thickness is exaggerated for easier understanding.

Referring to FIG. 8, the modified surface 101 of the stretchable substrate 100 is bonded to the modified surface 402 of the buffer pattern 400 such that a covalent bond is formed between the stretchable substrate 100 and the buffer pattern 400. An incomplete bond region exposed to the other surface 402 of the buffer pattern 400 and the one surface 101 of the stretchable substrate 100 forms a covalent bond region C2 through mutual bonding.

In an embodiment, when the stretchable substrate 100 and the buffer pattern 400 are formed of PDMS, which is a silicon-based elastomer, a siloxane bond (—Si—O—Si—O—), which is a kind of covalent bond between silicon and oxygen, is formed in the covalent bond region C2.

The buffer pattern 400 may have a Young's modulus that is higher than that of the stretchable substrate 100 and lower than that of the rigid member 200.

With the stretchable platform according to this embodiment, stretching stress is reduced by the buffer pattern 400. Thus, advantageously, the stretchable platform according to this embodiment operates stably even at a greater stretching force than a stretchable platform according to the prior art.

Experimental Example

An experimental example of the stretchable platform according to this embodiment will be described below with reference to FIGS. 9A and 9B. In this experiment, a stretchable substrate was formed by mixing liquid PDMS and crosslinker in a ratio of 25:1 and then curing the mixture, and a buffer pattern was formed by mixing liquid PDMS and crosslinker in a ratio of 10:1. In an embodiment shown in FIG. 9A, a rigid member was formed of a polyimide film having a thickness of 25 μm. In an embodiment shown in FIG. 9B, a rigid member was formed of a PEM film having a thickness of 25 μm.

FIG. 9A is a diagram showing a captured state in which a stretching force is provided to the stretchable platform. Referring to FIG. 9A, when a stretching force (strain) of 0% was provided, it can be seen that the stretchable substrate and the rigid member maintain the same shape. It can be seen that when the stretching force provided to the stretchable platform is increased, the shape of the stretchable substrate is expanded in a direction in which the stretching force is provided. Also, even when a stretching force of up to 70% is provided, it can be seen that the rigid member prevents the stretchable substrate from being delaminated so that the stretchable substrate maintains a bonding state.

Figure 9B:
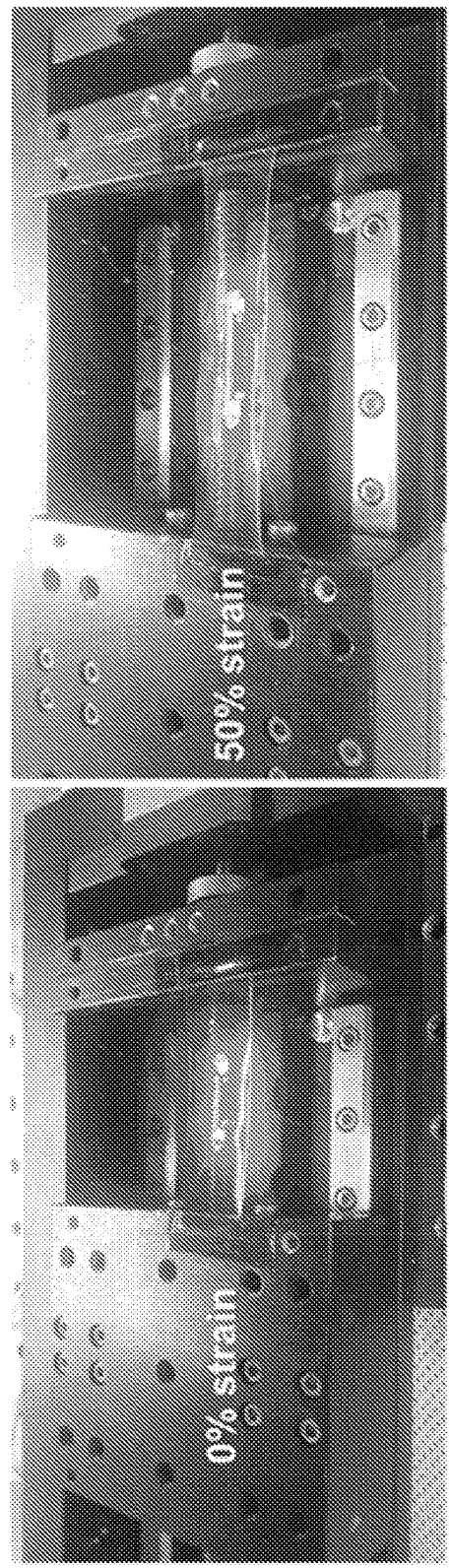
FIG. 9B is a diagram showing a state captured image of a state in which a stretching force is provided to the stretchable platform while a light emitting device is disposed on the rigid member.

FIG. 9B is a diagram showing a state captured image of a state in which a stretching force is provided to the stretchable platform while a light emitting device is disposed on the rigid member. In FIG. 9B, the drawing on the left side is a diagram showing a state in which a stretching force is provided to the stretchable substrate, and the drawing on the right is a diagram showing a stretching force of 50% is provided to the stretchable substrate. As can be seen from the drawing on the right side, even when a stretching force of 50% is provided, the light emitting device disposed on the rigid member emits light without the breakage of wires or the delamination of the rigid member.

While the embodiments shown in the drawings have been described as reference in order to help an understanding of the present invention, the above embodiments are merely illustrative for the purpose of implementation, and also it is to be understood by those skilled in the art that various modifications and equivalent embodiments may be made. Accordingly, the scope of the present invention should be defined by the accompanying claims.

INDUSTRIAL APPLICABILITY

Industrial applicability has been described above.

The invention claimed is:

1. A stretchable platform formation method, comprising the steps of:
   (a) forming an adhesive layer on one surface of a rigid member;
   (b) modifying one surface of a buffer pattern and one surface of the adhesive layer such that an incomplete bond is formed;
   (c) bonding the modified surface of the buffer pattern and the modified surface of the adhesive layer;
   (d) modifying the other surface of the buffer pattern and one surface of a stretchable substrate such that an incomplete bond is formed; and
   (e) bonding the other surface of the buffer pattern and the one surface of the stretchable substrate, wherein the rigid member has a higher Young's modulus than the buffer pattern and the buffer pattern has a higher Young's modulus than the stretchable substrate, and wherein both the buffer pattern and the stretchable substrate are formed of polydimethylsiloxane (PDMS).

2. The stretchable platform formation method of claim 1, wherein
step (c) is performed such that a covalent bond is formed between the buffer pattern and the adhesive layer, and
step (e) is performed such that a covalent bond is formed between the buffer pattern and the stretchable substrate.

3. The stretchable platform formation method of claim 1, wherein step (a) comprises the steps of:
(a1) modifying the one surface of the rigid member; and
(a2) forming the adhesive layer on the modified surface of the rigid member.

4. The stretchable platform formation method of claim 3, wherein
step (a1) is performed by treating the one surface of the rigid member through any one of ozone (O3), ultraviolet (UV), and plasma, and
step (a2) is performed by forming a silane-based organic material layer on the one surface of the rigid member.

5. The stretchable platform formation method of claim 1, wherein
step (b) is performed by plasma-treating the one surface of the buffer pattern and the one surface of the adhesive layer such that an incomplete bond is formed, and
step (d) is performed by plasma-treating the other surface of the adhesive layer and the one surface of the stretchable substrate such that an incomplete bond is formed.

6. The stretchable platform formation method of claim 5, wherein the plasma treatment is performed through any one of air plasma and oxygen plasma.

7. A stretchable platform comprising:
a stretchable substrate;
a rigid member located on the stretchable substrate;
a buffer pattern located between the rigid member and the stretchable substrate; and
an adhesive layer located between the rigid member and the buffer pattern and configured to bond the rigid member and the buffer pattern,
wherein the adhesive layer forms a covalent bond with the buffer pattern to bond the rigid member and the buffer pattern,
wherein the rigid member has a higher Young's modulus than the buffer pattern and the buffer pattern has a higher Young's modulus than the stretchable substrate, and
wherein both the buffer pattern and the stretchable substrate are formed of polydimethylsiloxane (PDMS).

8. The stretchable platform of claim 7, wherein the stretchable substrate and the buffer pattern are bonded by a covalent bond.

9. The stretchable platform of claim 7, wherein
the adhesive layer is a silane-based organic material layer,
the buffer pattern contains a silicon-based elastomer, and
the stretchable substrate contains a silicon-based elastomer.

10. The stretchable platform of claim 7, wherein the covalent bond includes a siloxane bond.

* * * * *